United States Patent
Pope et al.

(10) Patent No.: US 11,594,273 B2
(45) Date of Patent: Feb. 28, 2023

(54) ROW HAMMER DETECTION AND AVOIDANCE

(71) Applicant: HEWLETT PACKARD ENTERPRISE DEVELOPMENT LP, Houston, TX (US)

(72) Inventors: Eric L. Pope, Houston, TX (US); Melvin K. Benedict, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/070,865

(22) Filed: Oct. 14, 2020

(65) Prior Publication Data

US 2022/0115057 A1   Apr. 14, 2022

(51) Int. Cl.
| | |
|---|---|
| *G11C 29/52* | (2006.01) |
| *G11C 11/406* | (2006.01) |
| *G11C 11/408* | (2006.01) |
| *G11C 11/4078* | (2006.01) |

(52) U.S. Cl.
CPC ....... *G11C 11/40611* (2013.01); *G11C 11/408* (2013.01); *G11C 11/4078* (2013.01)

(58) Field of Classification Search
CPC ................................................ G11C 11/40611
See application file for complete search history.

(56) References Cited

U.S. PATENT DOCUMENTS

| | | | |
|---|---|---|---|
| 7,057,939 B2 | 6/2006 | Li et al. | |
| 10,885,976 B2 | 1/2021 | Ha | |
| 2005/0237814 A1* | 10/2005 | Li | G11C 16/10 365/185.28 |
| 2008/0106935 A1 | 5/2008 | Kim et al. | |
| 2019/0096472 A1* | 3/2019 | Kang | G11C 11/40611 |
| 2019/0287632 A1 | 9/2019 | Asano et al. | |
| 2020/0066342 A1* | 2/2020 | Ha | G11C 7/04 |

\* cited by examiner

*Primary Examiner* — Min Huang
(74) *Attorney, Agent, or Firm* — Sheppard Mullin Richter & Hampton LLP

(57) ABSTRACT

Systems and methods for detecting a row hammer in a memory comprising a plurality of memory cells arranged in a plurality of rows may include: a plurality of detection cells in a subject row of memory cells, the detection cells to be set to respective initial states and configured to transition to a state different from their initial states in response to activations of memory cells in an adjacent row of memory cells; a comparison circuit to compare current states of the detection cells with initial states of the detection cells and to determine whether any of the detection cells have a current state that is different from their corresponding initial states; and a trigger circuit to trigger a refresh of the memory cells in the subject row based on a detection of detection cells in the subject row having current states that are different from their corresponding initial states.

18 Claims, 5 Drawing Sheets

ROW HAMMER DETECTION AND AVOIDANCE

DESCRIPTION OF RELATED ART

A memory device includes memory cells to store data values. An example type of memory device is a dynamic random access memory (DRAM) device. As memory manufacturing technology has advanced, the feature size of memory cells has decreased to increase the density of memory cells in a memory device. Increasing the memory cell density provides increased storage capacity in the memory device. However, this increased density can also lead to loss of data due to, for example, parasitic effects. Other factors may also lead to a loss of data in the RAM memory cells.

Some conventional solutions to data loss rely on error correction techniques. However, where there is a large quantity of flipped bits, these error correction techniques may be ineffective. Another solution relies on more frequent memory refreshes to adjust the charge levels to their original values. However, more frequent memory refreshes typically mean greater power consumption, reduced performance and increased processing costs. Yet another solution relies on counters to identify frequently accessed memory rows and proactively refresh only the rows that are nearby the frequently accessed memory rows. This limits the amount of additional refreshing that may occur.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
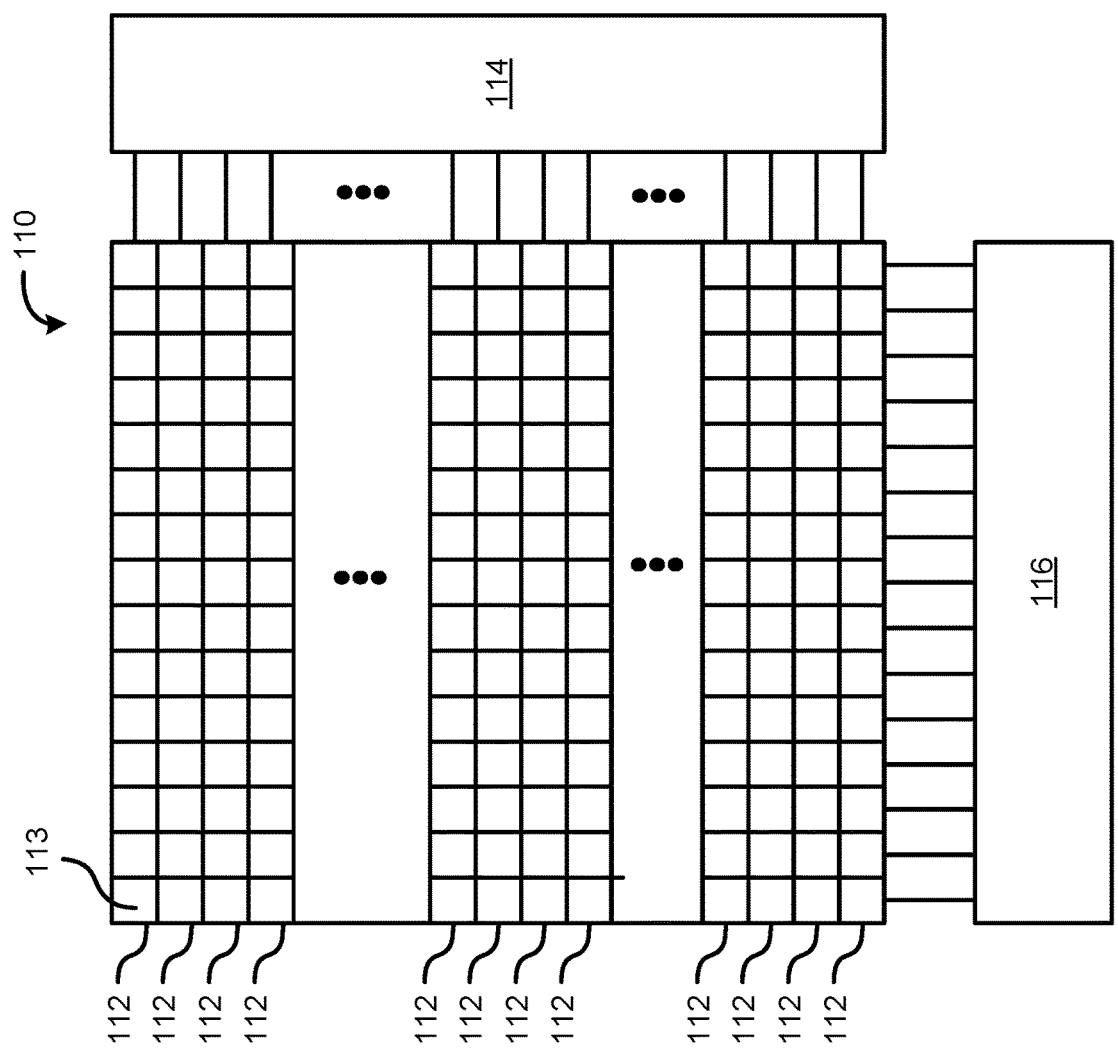
FIG. 1 illustrates an example memory device with which embodiments may be implemented.

The figures are not exhaustive and do not limit the present disclosure to the precise form disclosed.

DETAILED DESCRIPTION

Capacitor-based memory cells of a dynamic random access memory (DRAM) device store data by storing charges that represent the corresponding stored data. As memory capacity has increased, the size of memory cells, including DRAM cells, has decreased. These physically smaller cells are limited to storing correspondingly smaller charges. This results in a lower noise margin and a higher potential for parasitic interaction between cells or between cells and other parts of the DRAM circuit. This interaction, manifested as a charge leakage from one cell to nearby cells in adjacent rows or from other DRAM circuits to adjacent cells, can result in unintended changing of the memory contents of these nearby cells. Such an unintended change of memory contents results in a loss of data. These changes in stored data are sometimes referred to as soft memory errors or disturbance errors.

To forestall these losses, the memory cells of the DRAM device may be refreshed periodically to restore the charges in the cells to the appropriate levels. This refresh involves reading the data stored in the memory cells and rewriting the data back to the same memory cells. However, frequent DRAM row activations can cause unintended changes resulting in a loss of data more frequently than the refresh rate. In such a situation, the periodic refresh intervals may be insufficient to maintain the stored data. Frequent or repeated DRAM row activations may cause what is sometimes referred to as a row-hammer effect, which occurs when rapid activations in a given DRAM row cause higher than normal discharge rates of capacitors in memory cells in adjacent or other nearby rows. These frequent activations in a given row can cause these memory cells in adjacent or other nearby rows to change state, thereby corrupting the data stored in these nearby rows.

Embodiments of the present disclosure add additional cells to a DRAM row and these additional cells can be used to detect a row hammer. The additional cells can be configured to be more susceptible to parasitic interaction (e.g., store smaller levels of charge or be more sensitive to parasitic effects) such that they are more likely to flip state before the actual data storage cells flip state.

These additional cells, which may be referred to herein as detection cells, can be configured with a known initial state and can be periodically read and compared to the initial state to determine if any of these additional bits have flipped. If any bits have flipped, this may be an indication that a nearby row is affecting charge levels in the subject row. Because the data in these additional cells are configured to flip before actual storage cells might be affected, they provide an early warning mechanism that can be used to trigger a memory refresh before the hammer results in a loss of data. Embodiments are not limited to DRAM memory, but can be implemented with other types of memory that may be susceptible to data loss as a result of leakage or other similar effects.

Embodiments typically include at least two detection cells in addition to the data cells in the memory row, but may ideally include 4-8 detection cells, or more, to provide greater certainty that flipped bits in the detection cells are the result of a phenomenon like a row-hammer attack or other repeated activation event. Voting algorithms can be used to require a minimum threshold of flipped bits before refreshing the row. The system may be configured to err on the side of false positives, because an additional row refresh may be less "costly" than corrupted data.

Using detection cells in various embodiments may differ from conventional techniques in that this technique takes advantage of the effect of the row hammer itself for the detection. It adds additional, 'susceptible' cells to the memory rows for early detection (analogous to a canary in a coal mine). Additionally, it can be more efficient because it only requires monitoring of the additional cells, which does not require complex logic to implement. These additional detection cells can be implemented, for example, with lower capacitance such that they have a lower charge capacity, or with an enhanced leakage path. In this manner, these detection cells can be implemented to change state in response to phenomenon like a row hammer sooner than the data cells in the memory row are likely to be affected.

FIG. 1 illustrates an example memory device with which embodiments may be implemented. With reference data FIG. 1, in this example the DRAM memory device includes a memory array 110, made up of a plurality of memory rows 112 that are each made up of a plurality of cells (or bits) 113. For clarity, only the upper left cell 113 is labeled with reference characters to avoid unnecessary clutter in the drawing. This example illustrates only a single array 110, but in various implementations the DRAM may include a plurality of memory arrays 110.

A DRAM cell (e.g. cells 113) typically include a capacitor connected by a transistor to a bit line. The DRAM memory cell stores binary data as a stored charge on the capacitor. The amount of charge, Q, they can be stored by the capacitor in each cell is proportional to the capacitance of the capacitor in each cell.

The example of FIG. 1 also shows a row decoder 114 and a column decoder 116. Addressing circuitry (not illustrated) may access individual cells in the memory using a row address and a column address. A column address of the array to be addressed, where is the row address strobes the role of the row to be addressed. When a voltage is applied to a bit line for a column and an address line (sometimes referred to as a word line) for a row, the transistor in the memory cell at the intersection of those two lines is "turned on" and passes the voltage from the bit line to the corresponding storage capacitor in that cell. This has the effect of charging the capacitor.

As noted above, leakage currents may slowly deplete the charge, which may be addressed by refreshing the memory periodically. The refresh rate, normally on the order of tens of milliseconds, may generally be chosen to refresh the cells 113 at a rate greater than their expected discharge rate to avoid loss of data from such leakage currents. However, other events may cause more rapid changes in state that could cause loss of data to occur in between refresh cycles. For example, the above-mentioned hammer attack can cause a loss of data more quickly than the nominal refresh rate. One solution would be to increase the refresh rate to account for row-hammers and other like causes of memory errors. However more frequent refreshes can have an impact on power consumption and performance.

However, as also noted above one solution may be to provide a plurality of additional cells in some or all of the memory rows that can be used as detection bits to provide an early warning of impending data loss due to events such as, for example, a row-hammer attack. These additional cells can be configured to be more susceptible to row-hammer attacks and like events such that they flip state before the regular data cells flip state. Accordingly, if these more susceptible cells flip state this may indicate that other cells in the row, or in the vicinity, are also losing or gaining charge at faster than the normal rate accommodated by the determined refresh cycle. Thus, once one or more of the cells flip state, and out of cycle, early refresh can be initiated to reset the charges in the potentially affected cells. Although embodiments herein are described in terms of a DRAM memory, the disclosed technology may be implemented with other types of memory as well.

As noted above, the detection cells can be configured to be more susceptible than the data cells by, for example, designing them with a smaller capacitance so that they hold less charge. In some implementations, detection cells can be, for example, 5%, 10%, 15%, 20%, 25%, 30%, 35% or some other percentage more susceptible to changing state. Standard memory cells will typically vary in terms of their susceptibility to phenomenon such as a row hammer. Accordingly, not all standard memory cells may have their specified or desired nominal charge capacity. Such variations may be as a result of manufacturing tolerances, process variations and variations in materials across a die, and so on. Accordingly, these differences can be taken to account when specifying the susceptibility of detection cells. Detection cells can be designed to change state in response to row hammers more quickly than some, all, or most of the data cells will change state, considering such process or materials variations.

Figure 2:
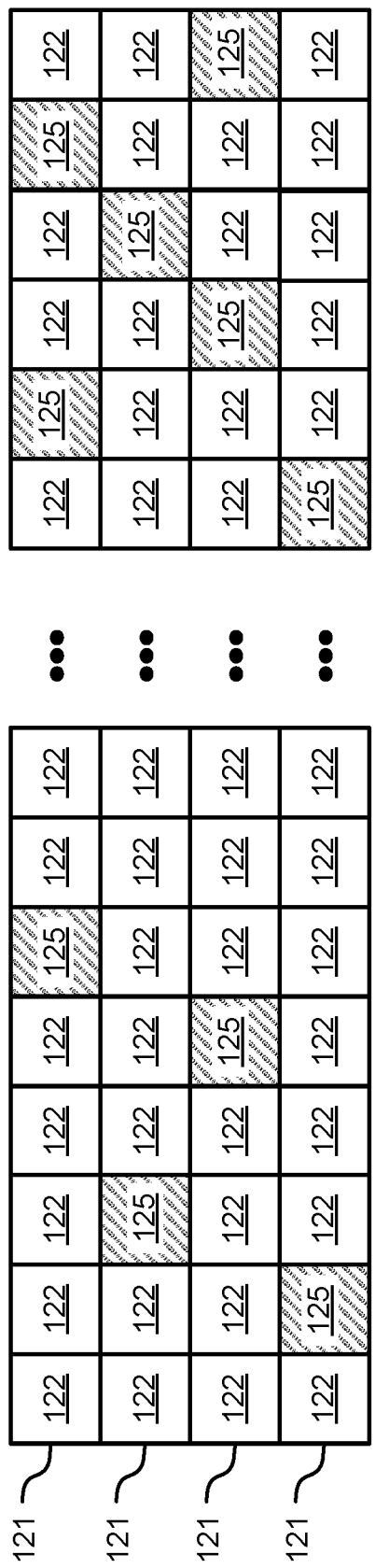
FIG. 2 illustrates an example configuration for DRAM memory rows with added detection bits in accordance with various embodiments.

FIG. 2 illustrates an example configuration for DRAM memory rows with added detection bits in accordance with various embodiments. This example illustrates four memory rows 121 (e.g., rows 112) each including a plurality of data cells 122 (e.g., cells 113). In embodiments, data cells 122 are the standard data cells that would normally be included in the rows of the DRAM to store addressable data. This example also illustrates added detection cells 125 that can be used to detect possible changes of state happening more rapidly than the refresh rate. This example illustrates two to three detection cells 125 distributed amongst the 14 data cells 121 of each row 121. However, in embodiments, there may be a fewer or greater quantity of detection cells 125 in each row 121. Embodiments may include, for example, 1, 2, 3, 4, 5, 6, 7, 8, 9, 10, or greater detection cells 125 in a row 121 of memory.

In embodiments, detection cells 125 may be evenly or somewhat evenly distributed along their respective rows 121. In other embodiments, detection cells 125 may be grouped together in groups of two or more cells. Embodiments may be implemented in which detection cells in one row 121 are not in the same column as detection cells in adjacent rows 121. More generally, embodiments may be implemented in which detection cells 125 are not placed in the vicinity of other detection cells. This may be desirable because a detection cell 125 may be more likely to sense (have its charge affected by) data read and write operations in an adjacent row 121 if it is directly adjacent cells 122 that are being accessed for read/write operations as opposed to directly adjacent other detection cells 125. In yet further embodiments, all of the detection cells 125 can be grouped together in each row such as, for example, at the beginning of the row, at the end of the row, or somewhere in the middle of the row.

Figure 3:
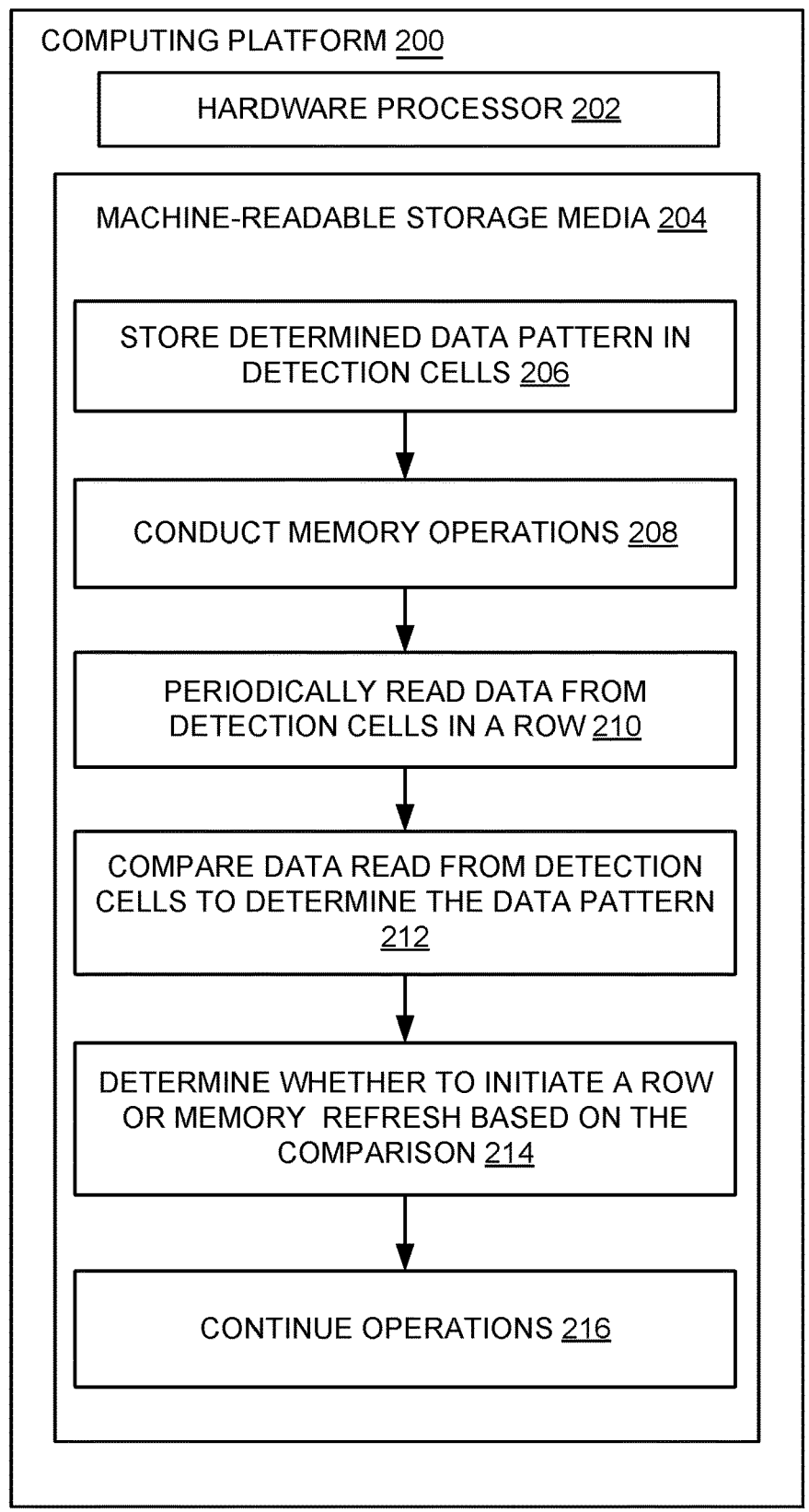
FIG. 3 illustrates an example processing circuit that may be used to perform row hammer detection in accordance with various embodiments.

FIG. 3 illustrates an example processing circuit that may be used to perform row hammer detection in accordance with various embodiments. Processing circuit 200 may be, for example, a server computer, a controller, processor or any other similar computing component capable of processing data. In the example implementation of FIG. 3, the processing circuit 200 includes a hardware processor 202, and machine-readable, non-transitory storage medium 204.

Hardware processor 202 may be one or more central processing units (CPUs), semiconductor-based microprocessors, and/or other hardware devices suitable for retrieval and execution of instructions stored in machine-readable storage medium 204. Hardware processor 202 may fetch, decode, and execute instructions, such as instructions 206-218, to control processes or operations for detecting a row hammers or like phenomenon. As an alternative or in addition to retrieving and executing instructions, hardware processor 202 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 204, may be any electronic, magnetic, optical, or other physical storage device that contains or stores executable instructions. Thus, machine-readable storage medium 204 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 204 may be a non-transitory storage medium, where the term "non-transitory" does not encompass transitory propagating signals. As described in detail below, machine-readable storage medium 204 may be encoded with executable instructions, for example, instructions 206-218.

Referring now to FIG. 3, hardware processor 202 may execute instruction 206 to store a determined data pattern in detection cells of a row of memory. For a given row, the system can be configured to store data bits (e.g., a one or a zero) in each of the various detection cells (e.g., detection cells 125). Embodiments may be configured to do this for some or all of the rows of a memory array. Embodiments typically include at least two additional bits as detection bits, but may ideally include 4-8 additional cells to provide greater certainty that a flipped bit is the result of a phenomenon like a row hammer. A quantity of detection bits greater than eight can also be provided. The number of detection bits implemented made depend on device physics and is preferably a sufficient number of bits to make a realistic determination.

In some embodiments, the same data pattern can be stored in each row. For example, if there are six detection cells in each row, and the and the six detection cells include as their stored bits 1, 1, 0, 1, 0, 1, each row can be configured with their respective detection cells having the same bits. In other embodiments, different data patterns can be stored in the detection cells in each row. Some embodiments may store more ones than zeros in the detection bits in each row because leakage from a one to a zero may be more likely to occur as a result of a phenomenon like a row-hammer attack.

Hardware processor 202 may execute instruction 208 to conduct memory operations. For example, the hardware processor 202 conducting the row hammer detection may also be the same processor conducting routine memory read/write operations. In other implementations, hardware processor 202 may be a dedicated processor or a processor not responsible for conducting routine memory read/write operations. Memory operations. Include, for example, memory access operations such as read and write operations and memory refresh operations. As noted above, memory refresh operations may occur at different refresh rates depending on the memory and its characteristics.

Hardware processor 202 may be execute instruction 210 to read data from detection cells in a given row. Instruction 210 may be configured to cause hardware processor 202 to read data from detection cells in a given row at regular periodic intervals, at random times, or at other times selected based on the execution of an algorithm. Generally speaking, the operation of reading data from the detection cells occurs more frequently than the refresh rate so that it can be used to detect a potential row hammer before data is lost between the normal memory refresh cycle.

The frequency with which data from detection cells is read may depend on the physical characteristics of the device such as, for example, capacitance/charge levels of the cells, susceptibility of cells to leakage, and other parameters that may affect or lead to data loss. In other embodiments, algorithms can be used to determine the frequency with which data is read from the detection cells. For example, an algorithm may be implemented to evaluate activity in adjacent rows and if a threshold quantity of read or write operations is exceeded in an adjacent row, the system can be configured to read data from the detection cells.

Hardware processor 202 may execute instruction 212 to compare data read from detection cells with the data pattern originally stored in the detection cells to determine the data stored in the read detection cells has changed state, or flipped. Consider the example above where there are six detection cells and the six detection cells include as their respective stored bits 1, 1, 0, 1, 0, and 1. In this case, hardware processor 202 may execute instruction 212 to compare the data read from the detection cells with this original pattern of bits to determine whether the pattern read from the detection cells has remained the same.

Hardware processor 202 may execute instruction 214 to determine whether to initiate a memory refresh based on the comparison. If the comparison indicates a sufficient number of detection bits have changed state, this may indicate a leakage or other problem in the row, such as from a row hammer attack, and this can be used to trigger a refresh for the row. For example, if one or more of the detection cells has changed, this may indicate a phenomenon, such as a row hammer attack in an adjacent row, is affecting charge levels in memory cells in the subject memory row. Because it is possible that a small number of cells may change state even if there is no issue with repeated activations in an adjacent cell (or nothing unusual going on), embodiments may be implemented to use a voting algorithm to reduce the number of false positive detections that may occur. For example, embodiments may be implemented that require a threshold number of detection bits to have changed state before detection of an impending data loss issue is declared. For example, the threshold may require two, three, four, or more detection bits be changed in order to declare an impending data loss issue such as that caused by a row hammer attack in adjacent row. The algorithm may be configured to trigger differently based on whether one or more 0 or 1 detection bits have changed state. For example, where a bit with a state of 1 is more susceptible to leakage, the algorithm might be configured to trigger if at least one 0 detection bit changes state or if at least two 1 detection bits change state.

Embodiments may be configured to implement voting algorithms that err on the side of false positives rather than false negatives because data loss issues can be problematic, and the cost of an occasional unnecessary refresh may be less than the cost associated with recovering lost data.

Hardware processor 202 may execute instruction 216 to continue the operations of reading and comparing data values in the detection bits to determine whether a row hammer phenomenon is occurring and whether a row should be refreshed prior to the normal refresh cycle.

Figure 4:
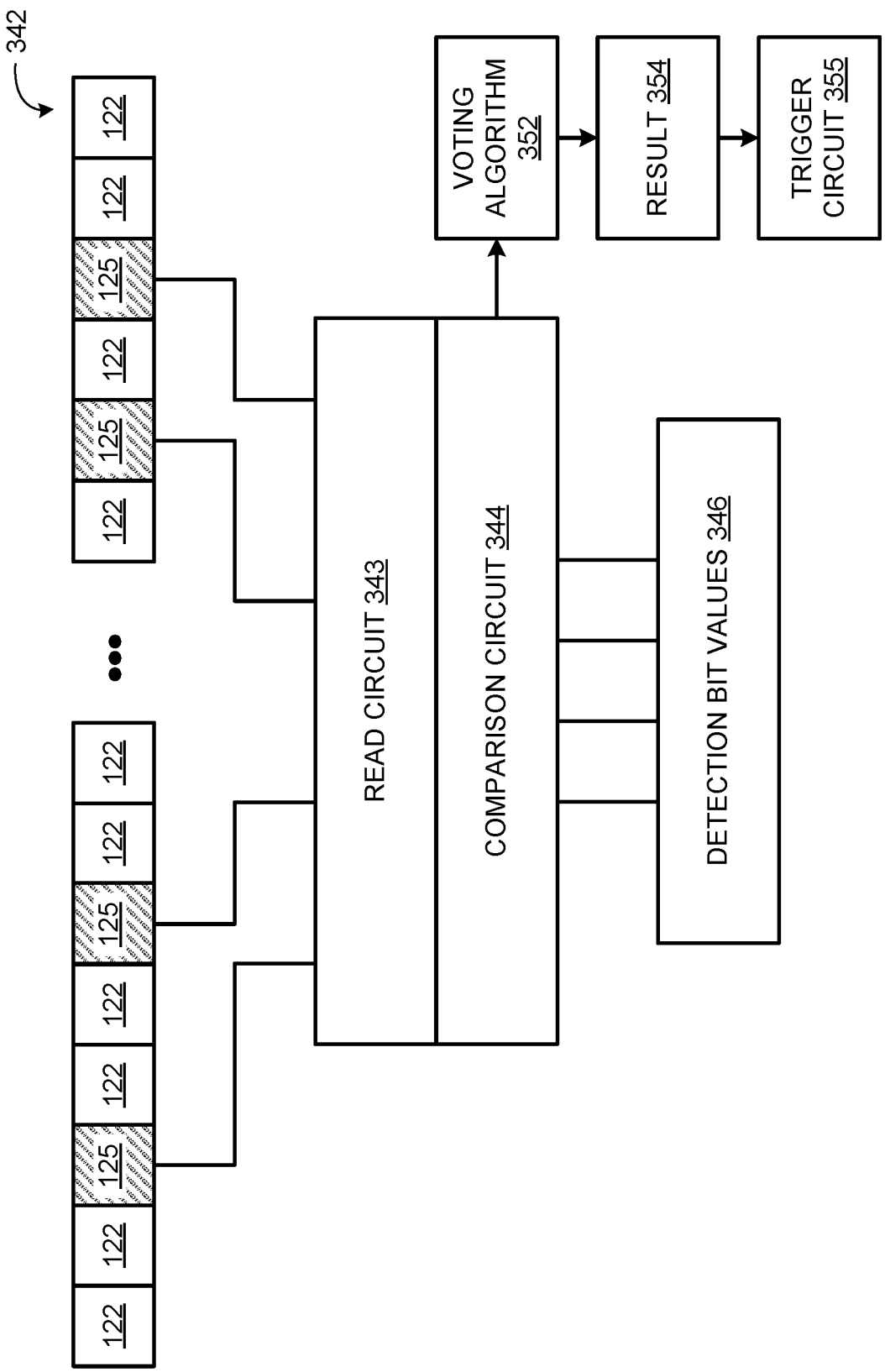
FIG. 4 illustrates a functional block diagram for detection bit comparison in accordance with various embodiments.

FIG. 4 illustrates a functional block diagram for detection bit comparison in accordance with various embodiments. With reference now to FIG. 4, in this example a memory row 342 includes a plurality of data cells 122 and detection cells 125. This example includes four detection cells 125, although embodiments may be implemented with other quantities of detection cells 125. As noted above, in embodiments detection cells 125 may be preloaded with known data values so that it can be determined whether they change state. The bit values for the detection cells can be stored in memory (e.g., in machine-readable storage media 204 or in other memory) as detection bit values 346.

A read circuit 343 may be implemented to read the data bits in the detection cells 125. This can be implemented as a separate circuit, or as a normal memory read operation configured to read the data values in detection cells 125. A comparison circuit 344 may be implemented to compare the read bit values of detection cells 125 with the detection bit values 346 originally stored in the detection cells 125. Comparison circuit 344 may be implemented, for example, as instructions executing on a processor such as, for example, instructions stored on machine-readable storage media 204 executed by hardware processor 202.

The results of the comparison may be provided to a decision circuit, which may include a voting algorithm 352 to determine whether, based on the comparison, the subject row 342 is susceptible to data loss as a result of phenomena such as, for example, a row-hammer attack. As noted above, voting algorithm 352 may take on a variety of different forms depending on the implementation and the objectives. For example, in one embodiment the voting algorithm can be configured to declare a risk of data loss if greater than a threshold quantity of bit values detection cells 125 have changed state. For example, for n detection cells in a row, the threshold can be set at any number from 0 to n−1. Some embodiments may require a higher threshold to reduce the number of false positives triggered by the comparison. Other embodiments may use a lower threshold to err on the side of more frequent memory refreshes to reduce the potential for data loss. As also noted above, embodiments may be implemented that place a greater weight on detection cells 125 whose initial value is set to a logic level 1 as compared to detection cells 125 whose initial value is set to a logic level 0, and vice versa.

The result 354 may be output so that appropriate action can be taken if deemed necessary. For example, where the voting algorithm 352 determines that a loss of data is predicted, the result 354 may trigger a reset of the data cells 122 (and detection cells 125) in the subject row. In terms of the example of FIG. 3, the result 354 may be provided to a trigger circuit 355 that is used to refresh the row. Trigger circuit 355, for example, can be implemented as hardware processor 202 to execute an instruction to refresh the subject row.

Figure 5:
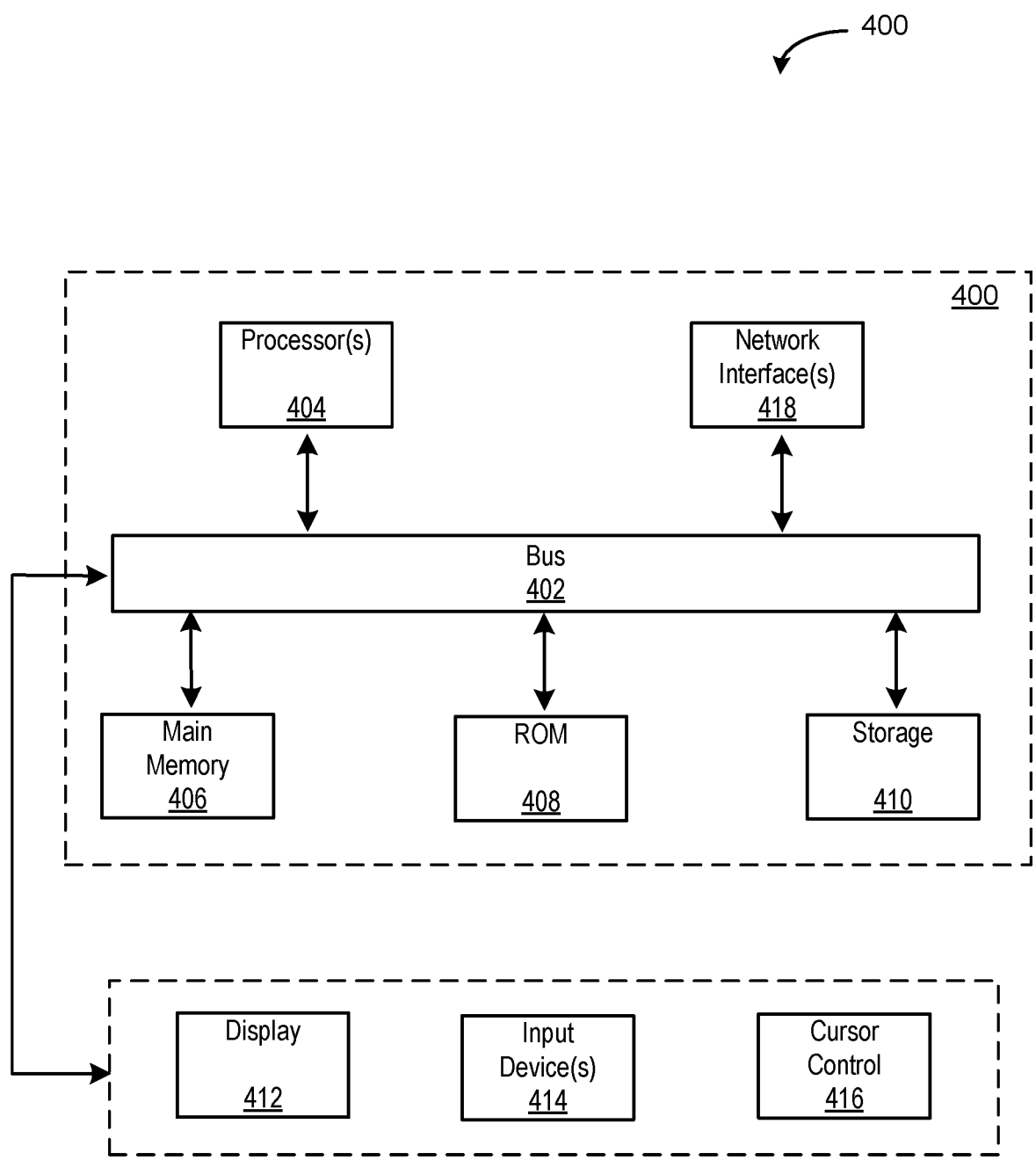
FIG. 5 is an example computing component that may be used to implement various features of embodiments described in the present disclosure.

FIG. 5 depicts a block diagram of an example computer system 400 in which various of the embodiments described herein may be implemented. The computer system 400 includes a bus 402 or other communication mechanism for communicating information, one or more hardware processors 404 coupled with bus 402 for processing information. Hardware processor(s) 404 may be, for example, one or more general purpose microprocessors.

The computer system 400 also includes a main memory 406, such as a random access memory (RAM), cache and/or other dynamic storage devices, coupled to bus 402 for storing information and instructions to be executed by processor 404. Main memory 406 also may be used for storing temporary variables or other intermediate information during execution of instructions to be executed by processor 404. Such instructions, when stored in storage media accessible to processor 404, render computer system 400 into a special-purpose machine that is customized to perform the operations specified in the instructions.

The computer system 400 further includes a read only memory (ROM) 408 or other static storage device coupled to bus 402 for storing static information and instructions for processor 404. A storage device 410, such as a magnetic disk, optical disk, or USB thumb drive (Flash drive), etc., is provided and coupled to bus 402 for storing information and instructions.

The computer system 400 may be coupled via bus 402 to a display 412, such as a liquid crystal display (LCD) (or touch screen), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. In some embodiments, the same direction information and command selections as cursor control may be implemented via receiving touches on a touch screen without a cursor.

The computing system 400 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor(s) 404 executing one or more sequences of one or more instructions contained in main memory 406. Such instructions may be read into main memory 406 from another storage medium, such as storage device 410. Execution of the sequences of instructions contained in main memory 406 causes processor(s) 404 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 410. Volatile media includes dynamic memory, such as main memory 406. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 402. Transmission media can also take the form of acoustic or light waves, such as those generated during radio-wave and infra-red data communications.

The computer system 400 also includes a communication interface 418 coupled to bus 402. Network interface 418 provides a two-way data communication coupling to one or more network links that are connected to one or more local networks. For example, communication interface 418 may be an integrated services digital network (ISDN) card, cable modem, satellite modem, or a modem to provide a data communication connection to a corresponding type of telephone line. As another example, network interface 418 may be a local area network (LAN) card to provide a data communication connection to a compatible LAN (or WAN component to communicated with a WAN). Wireless links may also be implemented. In any such implementation, network interface 418 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 418, which carry the digital data to and from computer system 400, are example forms of transmission media.

The computer system 400 can send messages and receive data, including program code, through the network(s), network link and communication interface 418. In the Internet example, a server might transmit a requested code for an application program through the Internet, the ISP, the local network and the communication interface 418.

The received code may be executed by processor 404 as it is received, and/or stored in storage device 410, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 400.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. Apparatus for detecting a row hammer in a memory comprising a plurality of memory cells to store data arranged in a plurality of rows, the apparatus comprising:
   a plurality of detection cells in a subject row of the plurality of rows of memory cells, the detection cells to be set to respective initial states and configured to transition to a state different from their initial states in response to activations of memory cells in an adjacent row of memory cells, wherein detection cells in the subject row have a lower charge capacity than nominal memory cells in the subject row;
a cell read circuit to read the states of the detection cells at determined intervals;
a comparison circuit to compare read states of the detection cells with initial states of the detection cells and to determine whether any of the detection cells have a current state that is different from their corresponding initial states; and
a trigger circuit to trigger a refresh of the memory cells in the subject row based on a detection of detection cells in the subject row having current states that are different from their corresponding initial states.

2. The apparatus of claim 1, wherein the detection cells in the subject row are configured to transition states in response to activations of memory cells in the adjacent row of memory cells more quickly than the memory cells in the subject row.

3. The apparatus of claim 1, wherein the detection cells in the plurality of detection cells are distributed at different locations across the subject row.

4. The apparatus of claim 1, wherein the trigger circuit triggers the refresh of the memory cells only after a majority of detection cells have changed state from their initial state.

5. The apparatus of claim 1, wherein the trigger circuit triggers the refresh of the memory cells only after a quantity greater than a threshold quantity of detection cells have changed state from their initial state.

6. The apparatus of claim 1, wherein detection cells in the subject row have a charge capacity of 20%-25% lower than a charge capacity of nominal memory cells in the subject row.

7. A method of detecting a row hammer in a memory comprising a plurality of memory cells to store data arranged in a plurality of rows and a plurality of detection cells in a subject row of the plurality of rows of memory cells, the detection cells to be set to respective initial states, the method comprising:
initializing a plurality of detection cells in a subject row of the plurality of rows of memory cells to known initial states, wherein the plurality of detection cells are configured to transition to a state different from their initial states in response to activations of memory cells in an adjacent row of memory cells;
reading the states of the detection cells at determined intervals;
comparing read states of the detection cells with the initial states of the detection cells and determining whether any of the detection cells have a current state that is different from their corresponding initial states; and
refreshing the memory cells in the subject row based on a detection of detection cells in the subject row having current states that are different from their corresponding initial states;
wherein detection cells in the subject row have a lower charge capacity than nominal memory cells in the subject row.

8. The method of claim 7, wherein the detection cells in the subject row are configured to transition states in response to activations of memory cells in the adjacent row of memory cells more quickly than the memory cells in the subject row.

9. The method of claim 7, wherein the detection cells in the plurality of detection cells are distributed at different locations across the subject row.

10. The method of claim 7, wherein refreshing comprises triggering the refresh of the memory cells only after a majority of detection cells have changed state from their initial state.

11. The method of claim 7, wherein refreshing comprises triggering the refresh of the memory cells only after a quantity greater than a threshold quantity of detection cells have changed state from their initial state.

12. The method of claim 7, wherein detection cells in the subject row have a charge capacity of 20%-25% lower than a charge capacity of nominal memory cells in the subject row.

13. A processing circuit for detecting a row hammer in a memory comprising a plurality of memory cells to store data arranged in a plurality of rows, the processing circuit comprising:
a hardware processor;
a non-transitory storage medium for storing program instructions, which when executed by the hardware processor, cause the hardware processor to perform the operations of:
initializing a plurality of detection cells in a subject row of the plurality of rows of memory cells to known initial states, wherein the plurality of detection cells are configured to transition to a state different from their initial states in response to activations of memory cells in an adjacent row of memory cells;
reading the states of the detection cells at determined intervals;
comparing read states of the detection cells with the initial states of the detection cells and determining whether any of the detection cells have a current state that is different from their corresponding initial states; and
refreshing the memory cells in the subject row based on a detection of detection cells in the subject row having current states that are different from their corresponding initial states; and
wherein detection cells in the subject row have a lower charge capacity than nominal memory cells in the subject row.

14. The processing of claim 13, wherein the detection cells in the subject row are configured to transition states in response to activations of memory cells in the adjacent row of memory cells more quickly than the memory cells in the subject row.

15. The processing of claim 13, wherein the detection cells in the plurality of detection cells are distributed at different locations across the subject row.

16. The processing of claim 13, wherein refreshing comprises triggering the refresh of the memory cells only after a majority of detection cells have changed state from their initial state.

17. The processing of claim 13, wherein refreshing comprises triggering the refresh of the memory cells only after a quantity greater than a threshold quantity of detection cells have changed state from their initial state.

18. The processing of claim 13, wherein detection cells in the subject row have a charge capacity of 20%-25% lower than a charge capacity of nominal memory cells in the subject row.

* * * * *